(12) United States Patent
Backer et al.

(10) Patent No.: US 11,864,452 B1
(45) Date of Patent: Jan. 2, 2024

(54) BLACK MASKING LAYER IN DISPLAYS HAVING TRANSPARENT OPENINGS

(71) Applicant: Apple Inc., Cupertino, CA (US)

(72) Inventors: Adam Backer, Albany, NY (US); Ze Yuan, Fremont, CA (US); Yi-Pai Huang, Zhubei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/844,543

(22) Filed: Jun. 20, 2022

Related U.S. Application Data

(60) Provisional application No. 63/236,634, filed on Aug. 24, 2021.

(51) Int. Cl.
*G09G 5/00* (2006.01)
*H10K 59/65* (2023.01)
*G02B 5/22* (2006.01)

(52) U.S. Cl.
CPC .............. *H10K 59/65* (2023.02); *G02B 5/22* (2013.01)

(58) Field of Classification Search
CPC . H01L 27/3234; H01L 51/5203; H01L 51/56; B02B 5/22; H10K 59/65
USPC .................................................. 345/102, 173
See application file for complete search history.

(56) References Cited

U.S. PATENT DOCUMENTS

| | | |
|---|---|---|
| 4,928,301 A | 5/1990 | Smoot |
| 6,977,705 B1 | 12/2005 | Chiang et al. |
| 8,179,381 B2 | 5/2012 | Frey et al. |
| 8,284,332 B2 | 10/2012 | Geaghan et al. |
| 8,345,129 B2 | 1/2013 | Kanade et al. |
| 9,341,846 B2 | 5/2016 | Popovich et al. |
| 9,519,154 B2 | 12/2016 | Bell |
| 10,268,884 B2 | 4/2019 | Jones et al. |
| 10,394,189 B2 | 8/2019 | Futterer |
| 10,756,136 B1* | 8/2020 | Ma .................... H01L 31/147 |

(Continued)

FOREIGN PATENT DOCUMENTS

WO    2020219267 A1    10/2020

OTHER PUBLICATIONS

Andrew Maimone et al., Computational Augmented Reality Eyeglasses, IEEE International Symposium on Mixed and Augmented Reality (ISMAR), Oct. 2013, IEEE, New York, New York, United States.

*Primary Examiner* — Jennifer T Nguyen
(74) *Attorney, Agent, or Firm* — Treyz Law Group, P.C.; Joseph F. Guihan

(57) ABSTRACT

An electronic device may include a display and an optical sensor formed underneath the display. The display may have both a full pixel density region and a pixel removal region with a plurality of high-transmittance areas that overlap the optical sensor. The display may include a black masking layer with a plurality of horizontal portions and a plurality of vertical portions that form a grid that defines a plurality of apertures. The black masking layer may additionally include patches in the apertures. The patches may be optimally positioned to mitigate diffraction artifacts in the sensor that operates through the pixel removal region. The patches may have unique sizes and shapes. The display may include first and second pixel removal regions with different black masking layer layouts. The layouts may cause complementary diffraction artifacts such that a single artifact-free image may be constructed using the first and second optical sensors.

21 Claims, 14 Drawing Sheets

(56) References Cited

U.S. PATENT DOCUMENTS

| | | |
|---|---|---|
| 2008/0165267 A1 | 7/2008 | Cok |
| 2010/0224880 A1 | 9/2010 | Kimura |
| 2012/0300307 A1 | 11/2012 | Borrelli et al. |
| 2015/0362776 A1* | 12/2015 | Jikumaru ............... H10K 59/40 |
| | | 349/12 |
| 2018/0052276 A1 | 2/2018 | Klienman et al. |
| 2019/0041658 A1 | 2/2019 | Gollier et al. |
| 2019/0207155 A1* | 7/2019 | Lee ......................... H01L 51/56 |
| 2019/0250450 A1 | 8/2019 | Li |
| 2019/0319222 A1* | 10/2019 | Gunji .................... H05B 33/22 |
| 2019/0377858 A1 | 12/2019 | He et al. |
| 2021/0191552 A1* | 6/2021 | Bok ....................... G06F 1/1652 |
| 2021/0202900 A1* | 7/2021 | Lee ....................... H10K 59/121 |
| 2022/0209124 A1* | 6/2022 | Nakamura .......... H01L 51/5203 |

* cited by examiner

US 11,864,452 B1

BLACK MASKING LAYER IN DISPLAYS HAVING TRANSPARENT OPENINGS

This application claims priority to U.S. provisional patent application No. 63/236,634, filed Aug. 24, 2021, which is hereby incorporated by reference herein in its entirety.

BACKGROUND

This relates generally to electronic devices, and, more particularly, to electronic devices with displays.

Electronic devices often include displays. For example, an electronic device may have a light-emitting diode (LED) display based on light-emitting diode pixels. In this type of display, each pixel includes a light-emitting diode and circuitry for controlling application of a signal to the light-emitting diode to produce light.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The display may have both a full pixel density region and a low pixel density region or pixel removal region. The pixel removal region includes a plurality of high-transmittance areas that overlap the optical sensor. Each high-transmittance area may be devoid of thin-film transistors and other display components. The plurality of high-transmittance areas regions is configured to increase the transmittance of light through the display to the sensor. The high-transmittance areas may therefore be referred to as transparent windows in the display.

The display may include a black masking layer with a plurality of horizontal portions and a plurality of vertical portions that form a grid. The horizontal and vertical portions may be regularly spaced or irregularly spaced. The horizontal and vertical portions may be linear or zig-zag. The grid defines a plurality of apertures.

The black masking layer may additionally include patches in the apertures. The patches may reduce transmission through the pixel removal region. However, the patches may be optimally positioned to mitigate diffraction artifacts in the sensor that operates through the pixel removal region. The patches may have unique sizes and shapes.

The display may include first and second pixel removal regions that overlap respective first and second optical sensors. The first pixel removal region may have a black masking layer with a first layout whereas the second pixel removal region may have a black masking layer with a second layout that is different than the first layout. The layouts may cause complementary diffraction artifacts such that a single artifact-free image may be constructed using the first and second optical sensors.

DETAILED DESCRIPTION

Figure 1:
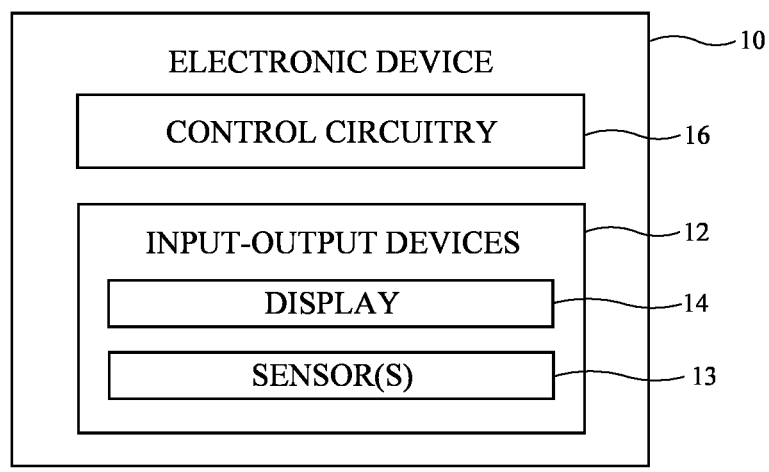
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display, a display formed from an array of discrete light-emitting diodes (microLEDs) each formed from a crystalline semiconductor die, or any other suitable type of display. Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
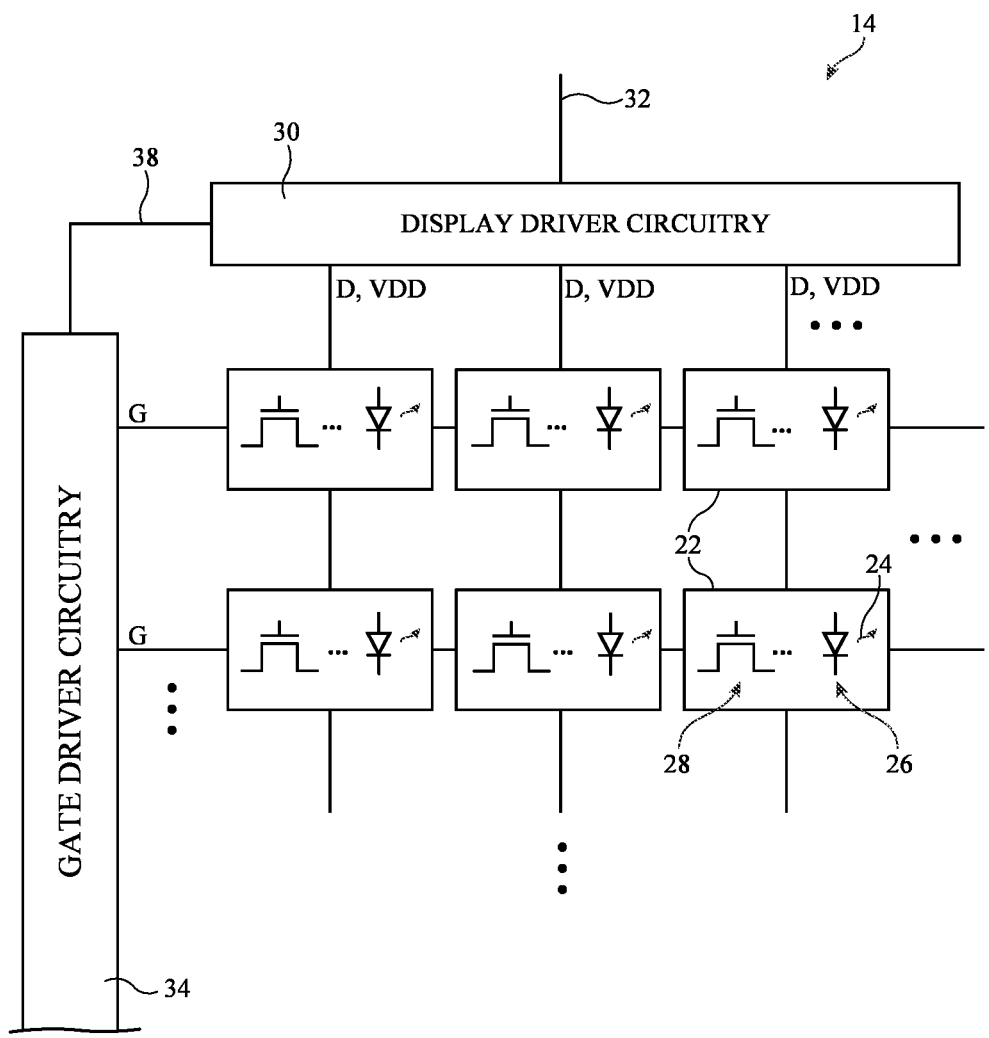
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
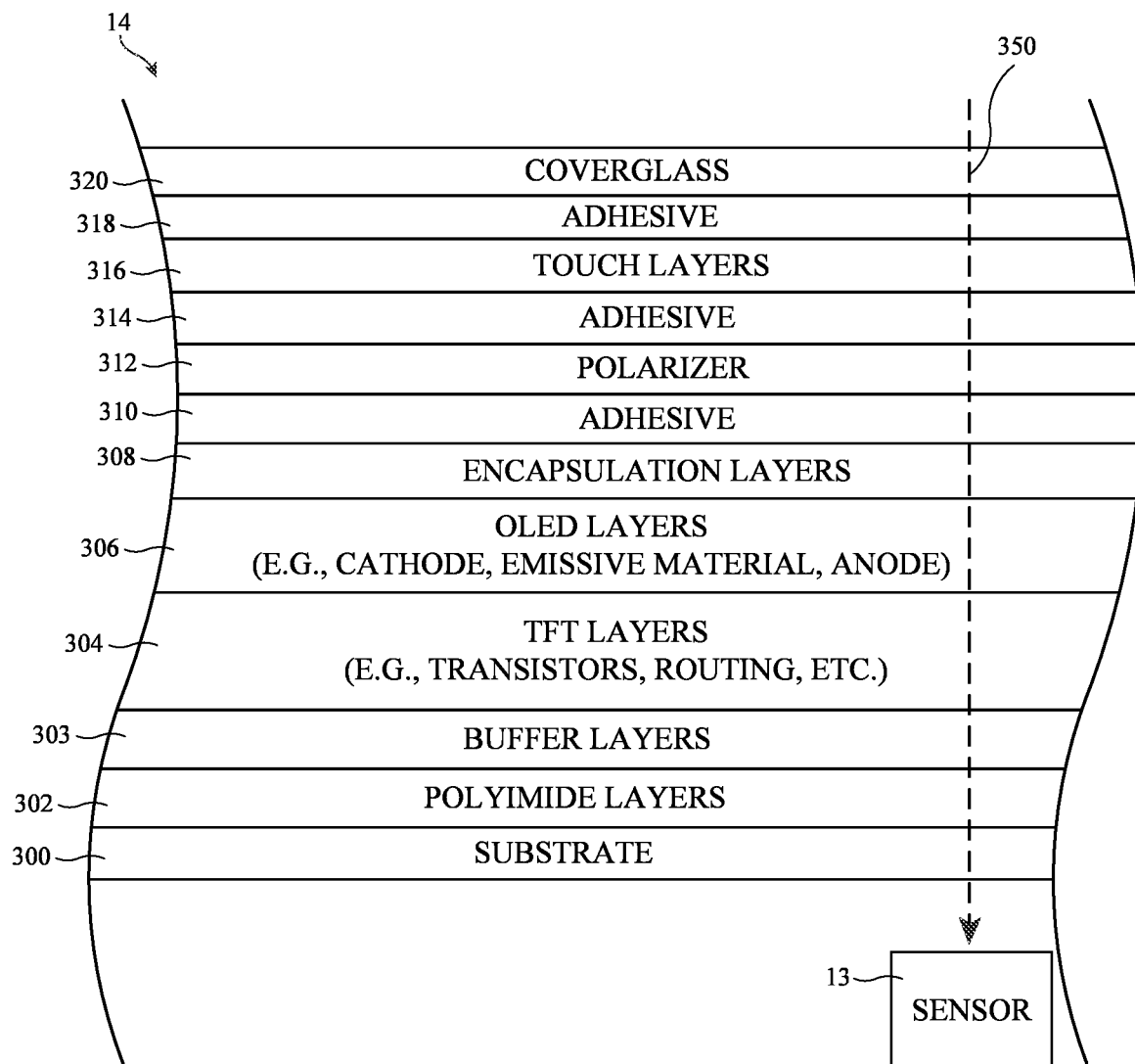
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

It should be noted that polarizer 312 may be omitted from the display if desired.

The example in FIG. 3 of the display stack including OLED layers is merely illustrative. As previously noted, the display stack may include pixels formed using other display technology. For example, the display stack may include an array of discrete light-emitting diodes each formed from a crystalline semiconductor die (e.g., an array of microLEDs).

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In some cases, sensor 13 may include a light-emitting component that emits light through the display. Sensor 13 may therefore sometimes be referred to as input-output component 13. Input-output component 13 may be a sensor or a light-emitting component (e.g., that is part of a sensor). The performance of input-output component 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions or low density pixel regions. Removing display pixels (e.g., removing transistors and/or capacitors associated with one or more sub-pixels) in the pixel removal regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

It should be noted that the display stack (as in FIG. 3) may include a black masking layer to mitigate undesired reflections off the display stack. One or more black masking layers may be incorporated at any desired location within the display stack. A black masking layer may be incorporated above one or more of OLED layers 306, encapsulation layers 308, polarizer 312, etc.

Figure 4:
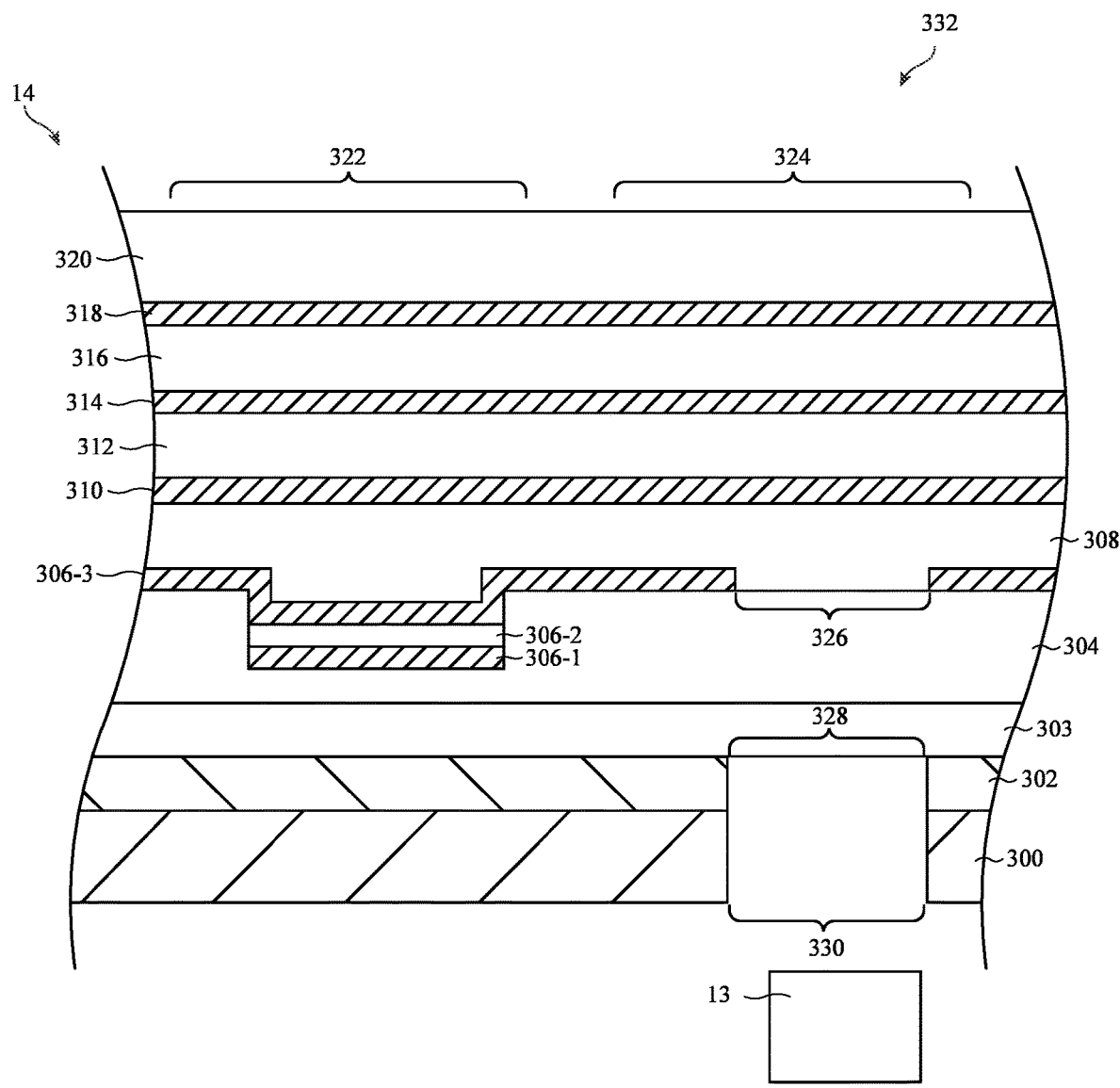
FIG. 4 is a cross-sectional side view of an illustrative display stack with a high-transmittance area that overlaps a sensor in accordance with an embodiment.

FIG. 4 is a cross-sectional side view of an illustrative display showing how pixels may be removed in a pixel removal region 332 to increase transmission through the display. As shown in FIG. 4, display 14 may include a pixel region 322 and a high-transmittance area 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In high-transmittance area 324, anode 306-1 and emissive material 306-2 may be omitted. Without the high-transmittance area, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in high-transmittance area 324 to increase transmittance.

Additional transmission improvements through the display stack may be obtained by selectively removing additional components from the display stack in high-transmittance area 324. As shown in FIG. 4, a portion of cathode 306-3 may be removed in high-transmittance area 324. This results in an opening 326 in the cathode 306-3. Said another way, the cathode 306-3 may have conductive material that defines an opening 326 in the pixel removal region. Removing the cathode in this way allows for more light to pass through the display stack to sensor 13 (or to pass through the display stack from component 13 towards a viewer in embodiments where input-output component 13 emits light). Cathode 306-3 may be formed from any desired conductive material. The cathode may be removed via etching (e.g., laser etching or plasma etching). Alternatively, the cathode may be patterned to have an opening in high-transmittance area 324 during the original cathode deposition and formation steps.

Polyimide layers 302 may be removed in high-transmittance area 324 in addition to cathode layer 306-3. The removal of the polyimide layers 302 results in an opening 328 in the pixel removal region. Said another way, the polyimide layer may have polyimide material that defines an opening 328 in the high-transmittance region. The polyimide layers may be removed via etching (e.g., laser etching or plasma etching). Alternatively, the polyimide layers may be patterned to have an opening in high-transmittance area 324 during the original polyimide formation steps. Removing the polyimide layer 302 in high-transmittance area 324 may result in additional transmittance of light to sensor 13 in high-transmittance area 324.

Substrate 300 may be removed in high-transmittance area 324 in addition to cathode layer 306-3 and polyimide layer 302. The removal of the substrate 300 results in an opening 330 in the high-transmittance area. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in high-transmittance area 324 during the original substrate formation steps. Removing the substrate 300 in high-transmittance area 324 may result in additional transmittance of light in high-transmittance area 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

The example in FIG. 4 of the display stack including OLED pixels with emissive material 306-2 is merely illustrative. As previously noted, the display stack may include pixels formed using other display technology. For example, the display stack may include an array of discrete light-emitting diodes each formed from a crystalline semiconductor die (e.g., an array of microLEDs). In a display of this type, as with the OLED display, one or more components may optionally be removed in high-transmittance area 324 to increase transmittance.

Furthermore, as previously noted, a black masking layer may be incorporated above one or more of OLED layers 306, encapsulation layers 308, and polarizer 312 in FIG. 4. The black masking layer may be patterned to have openings in high-transmittance areas 324 to increase the transmittance through the display stack. The black masking layer may be present in the pixel removal region 332 and other full pixel density portions of the display.

Figure 5:
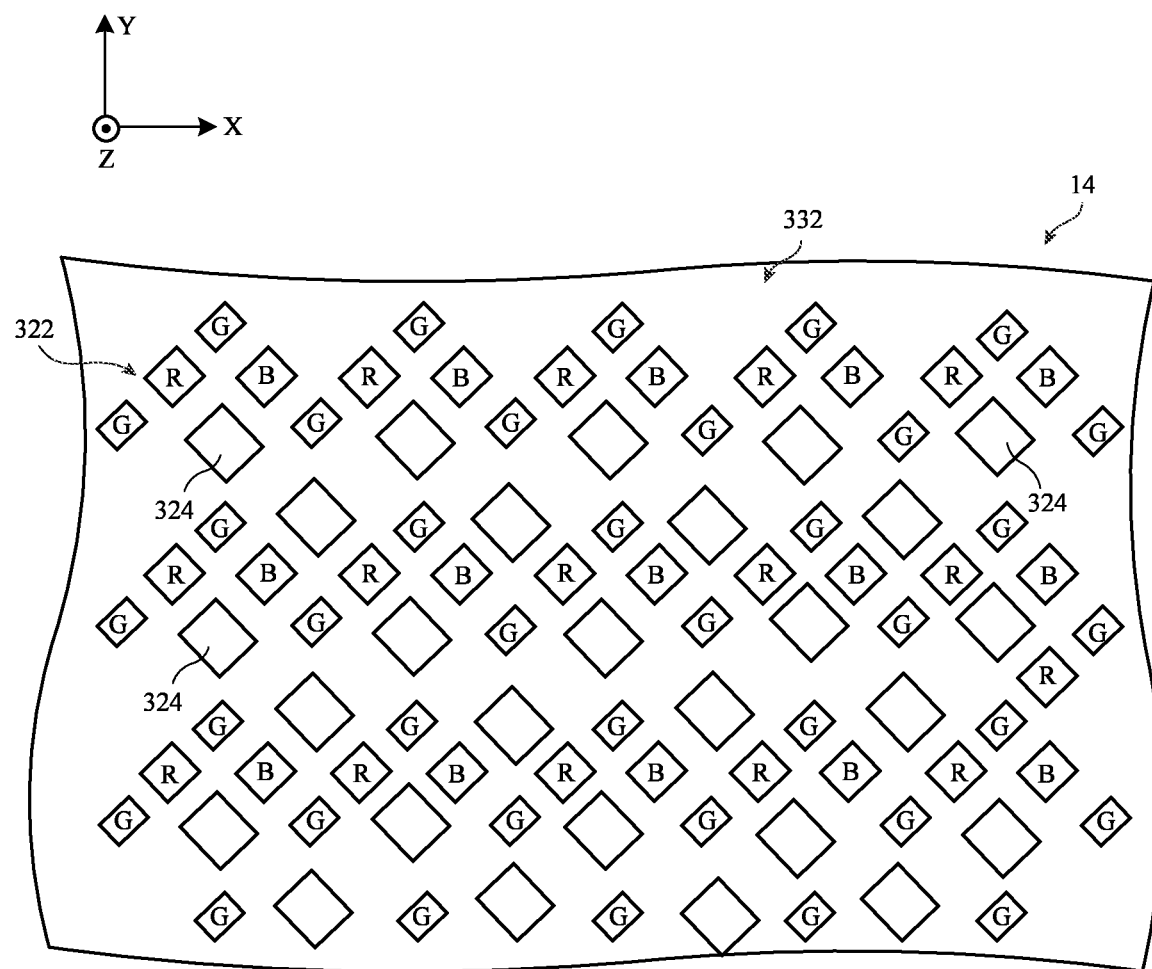
FIG. 5 is a top view of an illustrative display with transparent openings that overlap a sensor in accordance with an embodiment.

FIG. 5 is a top view of an illustrative display showing how high-transmittance areas may be incorporated into a pixel removal region 332 of the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. Different nomenclature may be used to refer to the red, green, and blue pixels in the display. As one option, the red, blue, and green pixels may be referred to simply as pixels. As another option, the red, blue, and green pixels may instead be referred to as red, blue, and green sub-pixels. In this example, a group of sub-pixels of different colors may be referred to as pixel. In high-transmittance areas 324, no sub-pixels are included in the display (even though sub-pixels would normally be present if the normal sub-pixel pattern was followed).

To provide a uniform distribution of sub-pixels across the display surface, an intelligent pixel removal process may be implemented that systematically eliminates the closest sub-pixel of the same color (e.g., the nearest neighbor of the same color may be removed). The pixel removal process may involve, for each color, selecting a given sub-pixel, identifying the closest or nearest neighboring sub-pixels of the same color (in terms of distance from the selected sub-pixel), and then eliminating/omitting those identified sub-pixels in the final pixel removal region. With this type of arrangement, there may be high-transmittance areas in the pixel removal region, allowing a sensor or light-emitting component to operate through the display in the pixel removal region. Additionally, because some of the pixels remain present in the pixel removal region (e.g., 50% of the pixels in the layout of FIG. 5), the pixel removal region may not have a perceptibly different appearance from the rest of the display for a viewer.

As shown in FIG. 5, display 14 may include an array of high-transmittance areas 324. Each high-transmittance area 324 may have pixels removed in that area. Each high-transmittance area also has an increased transparency compared to pixel region 322. The high-transmittance areas 324 may sometimes be referred to as transparent windows 324, transparent display windows 324, transparent openings 324, transparent display openings 324, etc. The transparent display windows may allow for light to be transmitted through the display to an underlying sensor or for light to be transmitted through the display from a light source underneath the display. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display.

The pattern of pixels (322) and high-transmittance areas (324) in FIG. 5 is merely illustrative. In FIG. 5, discrete high-transmittance areas 324 are depicted. However, it should be understood that these high-transmittance areas may form larger, unitary transparent openings if desired.

The pattern of sub-pixels and pixel removal regions in FIG. 5 is merely illustrative. In FIG. 5, the display edge may be parallel to the X axis or the Y axis. The front face of the display may be parallel to the XY plane such that a user of the device views the front face of the display in the Z direction. In FIG. 5, every other sub-pixel may be removed for each color. The resulting pixel configuration has 50% of the sub-pixels removed. In FIG. 5, the remaining pixels follow a zig-zag pattern across the display (with two green sub-pixels for every one red or blue sub-pixel). In FIG. 5, the sub-pixels have edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to the display edge, a different proportion of pixels may be removed for different colors, the remaining pixels may follow a different pattern, etc.

Figure 6A:
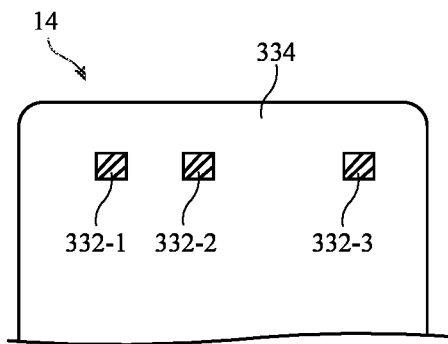
FIGS. 6A-6F are top views of illustrative displays showing possible positions for pixel removal regions in accordance with an embodiment.

In general, the display sub-pixels may be partially removed from any region(s) of display 14. FIGS. 6A-6F are front views showing how display 14 may have one or more localized pixel removal regions in which the sub-pixels are selectively removed. The example of FIG. 6A illustrates various local pixel removal regions 332 (sometimes referred to as low pixel density regions) physically separated from one another (i.e., the various pixel removal regions 332 are non-continuous) by full pixel density region 334. The full pixel density region 334 (sometimes referred to as full pixel density area 334) does not include any transparent windows 324 (e.g., none of the sub-pixels are removed and the display follows the pixel pattern without modifications). The full pixel density region 334 has a higher pixel density (pixels per unit area) than low pixel density regions 332. The three pixel removal regions 332-1, 332-2, and 332-3 in FIG. 6A might for example correspond to three different sensors formed underneath display 14 (with one sensor per pixel removal region).

Figure 6B:
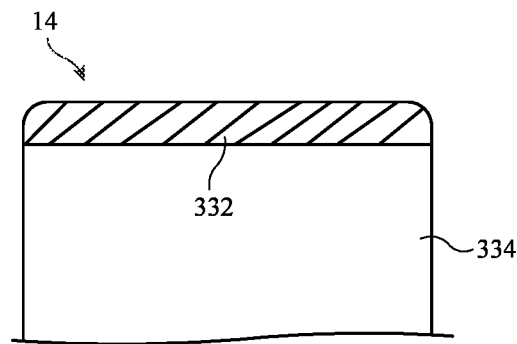
Figure 6C:
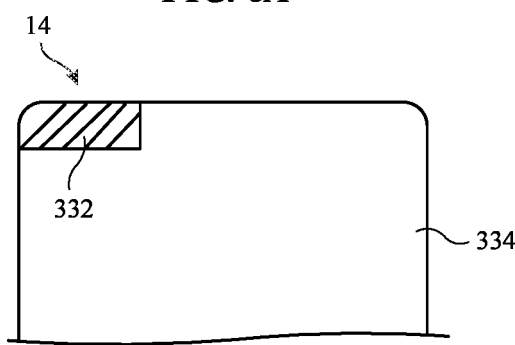
Figure 6D:
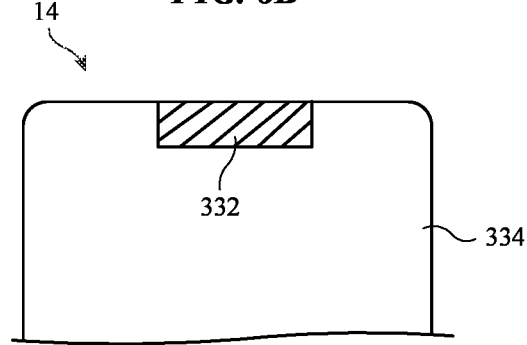
Figure 6E:
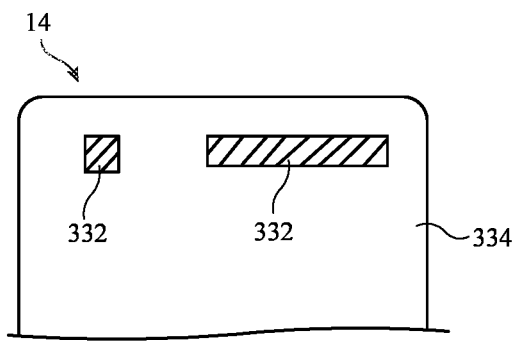
Figure 6F:
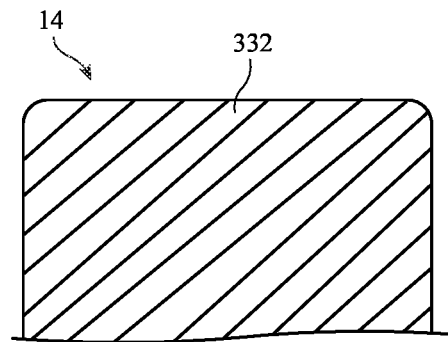

The example of FIG. 6B illustrates a continuous pixel removal region 332 formed along the top border of display 14, which might be suitable when there are many optical sensors positioned near the top edge of device 10. The example of FIG. 6C illustrates a pixel removal region 332 formed at a corner of display 14 (e.g., a rounded corner area of the display). In some arrangements, the corner of display 14 in which pixel removal region 332 is located may be a rounded corner (as in FIG. 6C) or a corner having a substantially 900 corner. The example of FIG. 6D illustrates a pixel removal region 332 formed only in the center portion along the top edge of device 10 (i.e., the pixel removal region covers a recessed notch area in the display). FIG. 6E illustrates another example in which pixel removal regions 332 can have different shapes and sizes. FIG. 6F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

Although the transmission of the low pixel density region is increased to improve sensor performance through the low pixel density region, the display may still need display components for the remaining pixels such as anodes, gate lines, data lines, power supply lines, etc. Therefore, in the low pixel density regions 332, the display may have an opaque footprint. The opaque footprint is defined by the opaque components in the low pixel density region (e.g., the anodes, signal lines, etc.). To mitigate undesired reflections, a black masking layer may be patterned to overlap one or more other opaque components in low pixel density region 332 (such as signal lines). The black masking layer 54 therefore may at least partially define the opaque footprint of the display.

In some cases, the opaque footprint of the display may be periodic. In other words, the opaque footprint may have regular, repeating shapes (caused by the periodic layout of the pixels in low pixel density region 332). These repetitive, opaque structures with small transparent gaps between them may create visible artifacts when sensing light through the display. Diffraction of environmental light that passes through the display to sensor 13 results in undesirable visible artifacts such as rainbow effects and diffraction spikes.

Figure 7A:
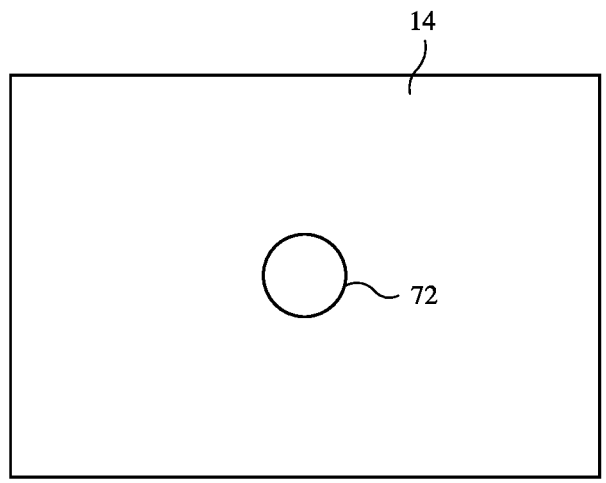
FIGS. 7A and 7B are top views showing the appearance of a point light source viewed through a display in accordance with an embodiment.
Figure 7B:
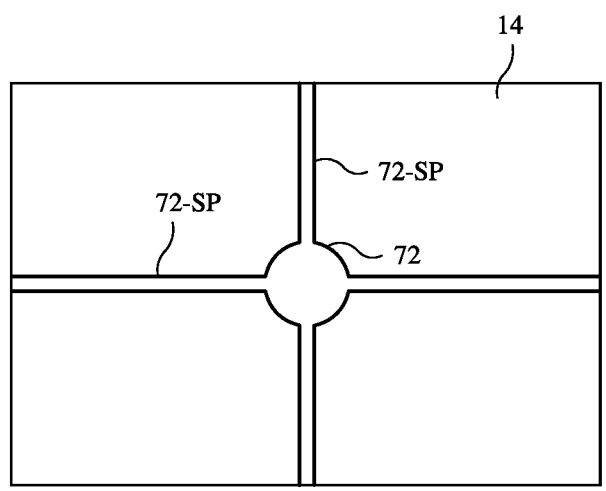

An example of these diffraction effects is shown in FIGS. 7A and 7B. In particular, consider the example of a point light source that is viewed through low pixel density region 332 by sensor 13. When sensed by sensor 13, the point light source should (ideally) appear as a circular area of light. FIG. 7A shows an example of this type, with the light from the point source appearing over area 72. In FIG. 7A (e.g., in an ideal scenario where no diffraction artifacts are present), area 72 has a circular shape without additional spikes or rainbow effects. In practice, the repeating structures of the low pixel density region may result in area 72 having an appearance as shown in FIG. 7B. As shown, area 72 in FIG. 7B includes spike portions 72-SP in addition to a circular portion.

These types of diffraction artifacts are undesirable. There are numerous ways to mitigate these types of diffraction artifacts while still including the requisite opaque components of the display. One way to mitigate diffraction artifacts is to add optimally placed patches to the black masking layer.

Figure 8A:
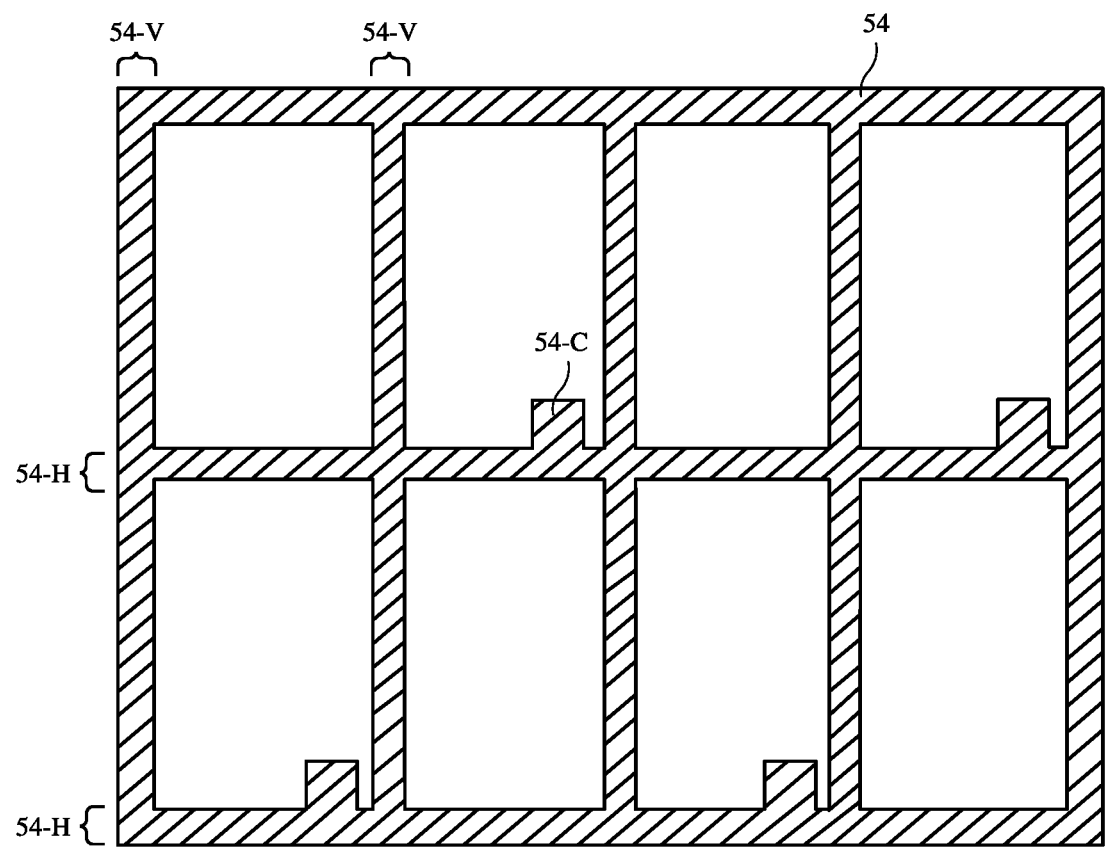
FIGS. 8A and 8B are top views of an illustrative black masking layer in a display in a regular grid before and after patches are added to mitigate diffraction artifacts in accordance with an embodiment.

FIG. 8A is a top view of an illustrative black masking layer 54 before adding the optimally placed patches. As shown, black masking layer 54 includes vertically extending portions 54-V and horizontally extending portions 54-H that form a grid. The vertically extending portions 54-V and horizontally extending portions 54-H may cover signal lines for the display. For example, the vertically extending portions 54-V may overlap data lines and/or power supply lines whereas the horizontally extending portion 54-H may overlap gate lines. In FIG. 8A, the horizontal and vertical portions are regularly spaced. The black masking layer in FIG. 8A may therefore sometimes be referred to as a regular grid.

Additionally, the black masking layer 54 may include portions 54-C that overlap vias in the display (e.g., vias that electrically connect the cathode layer to thin-film transistor circuitry in the substrate). Portions 54-C of the black masking layer may be patterned to cover the vias.

The opaque footprint of the display in low pixel density region 332 may include other portions defined by components that are different than the black masking layer. For example, the anodes for each LED may contribute to the opaque footprint of the display. However, the majority of the opaque footprint may be defined by the black masking layer in some embodiments.

Figure 8B:
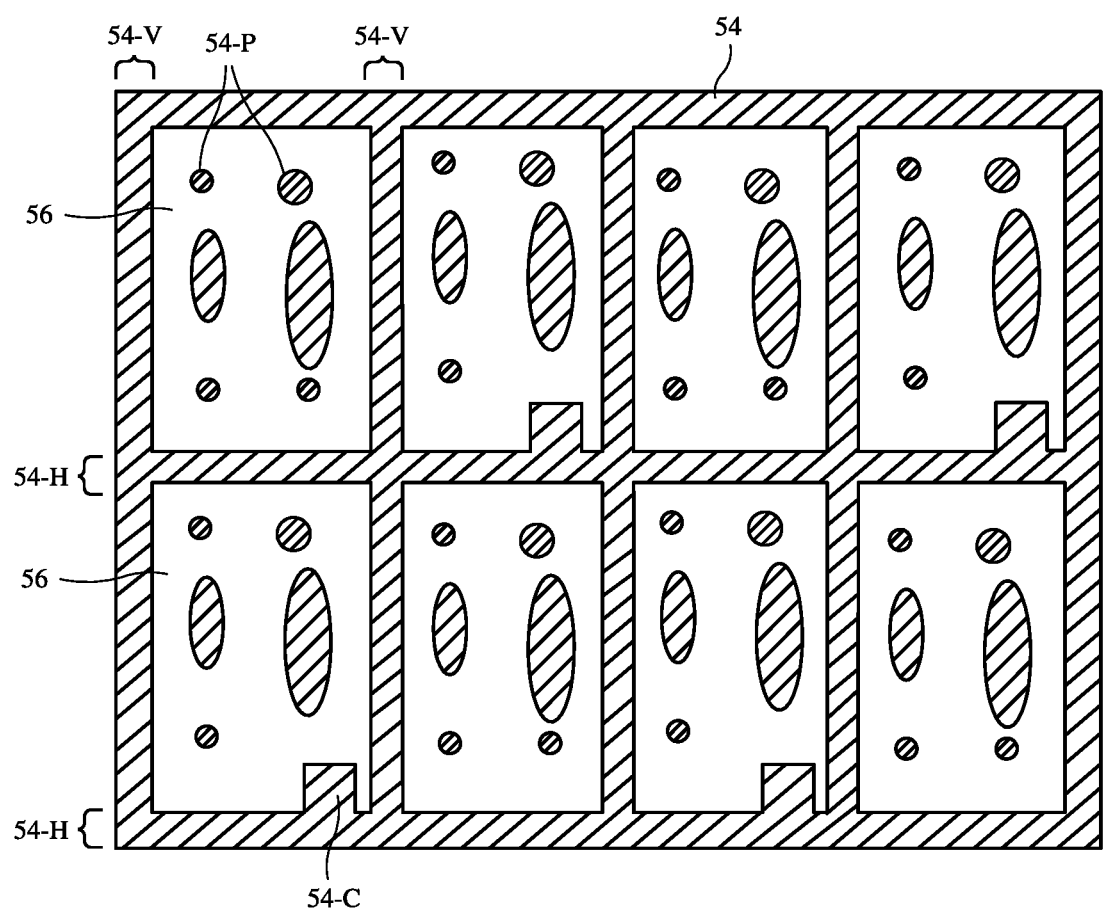

Regardless of which components define the opaque footprint of the display, additional black masking layer may be included in the display to mitigate diffraction artifacts. FIG. 8B is a top view of an illustrative black masking layer 54 that includes patches for diffraction mitigation. As shown in FIG. 8B, black masking layer 54 includes patches 54-P in addition to horizontal portions 54-H, vertical portions 54-V, and via portions 54-C.

The patches (sometimes referred to as islands, diffraction artifact mitigating patches, diffraction artifact mitigating islands, etc.) are formed in an otherwise light-transmitting aperture of the display. In other words, without the presence of patches 54-P, light may pass uninterrupted through apertures 56 that are defined by horizontal portions 54-H and vertical portions 54-V. However, the apertures are periodic and therefore may contribute to diffraction artifacts in a sensor that operates through the display. The patches 54-P are positioned in the apertures and do not transmit incident light (e.g., the patches absorb or reflect incident light). Each patch 54-P (as well as the remaining portions of black masking layer 54) may have a transmittance of less than 40%, less than 20%, less than 10%, less than 5%, less than 1%, etc. Each patch 54-P is completely laterally surrounded by a high-transmission portion of the display (e.g., having a transmittance of greater than 40%, greater than 50%, greater than 60%, greater than 70%, greater than 90%, greater than 90%, greater than 95%, greater than 99%, etc.). In other words, each patch 54-P is completely laterally surrounded by an uncovered portion of a respective aperture 56.

Adding the patches 54-P to the black masking layer therefore reduces the overall transmission of light through low pixel density region 332. However, the patches 54-P may have optimal positions to mitigate diffraction artifacts. Depending on the design of the particular electronic device, transmission may be sacrificed for improved diffraction artifacts (by including patches 54-P).

Each patch 54-P may have any desired size and shape. The patches may have regular shapes (circular, oval, square, non-square rectangular, etc.) or irregular shapes. Each aperture may have the same arrangement of patches, some but not all apertures may have the same arrangement of patches, or all of the apertures may have a unique arrangement of patches. The patch arrangement may have a repeating unit cell that is repeated for groups of apertures. For example, each 2×2 group of apertures may have the same layout of patches or each 4×4 group of apertures may have the same layout of patches. The example of the repeating unit cell being 2×2 or 4×4 is merely illustrative. In general, the repeating unit cell may have any desired size/shape.

The black masking layer patches 54-P may be positioned in optimal locations in each aperture to mitigate diffraction artifacts. In particular, the black masking layer layout may be selected to optimize the loss function $L=\Sigma_{j=1}^{N}I_j^2$ such that $R>\delta$, where the loss-function L is the sum of the squares of the intensity falling into each of the N diffraction orders $I_j$ produced by the display. The parameter R refers to the ratio of display area that is transparent (un-blocked by the black masking layer, display pixels, or other opaque display components). $\delta$ is a user-specified parameter that enforces the minimum permissible open-aperture ratio.

By optimizing the aforementioned loss function (subject to the open-aperture ratio requirement), diffraction can be suppressed while simultaneously meeting a user-specified overall transmission target. The loss function may be optimized using any desired techniques. As one example, a steepest descent algorithm may be used to minimize the loss function. The optimization (e.g., implemented in software) may use an optical simulation to calculate diffracted intensity and may compute gradients of the loss-function with respect to design parameters in a computationally efficient manner.

Each aperture may include one patch, at least two patches, at least three patches, at least four patches, at least five patches, at least six patches, more than six patches, more than ten patches, etc. The patches in a given aperture may each have a unique respective shape or two or more patches in a given aperture may have the same shape. The pixel removal region may therefore include one unique patch shape, at least two unique patch shapes, at least four unique patch shapes, at least eight unique patch shapes, at least sixteen unique patch shapes, etc.

The optimal arrangement for the number, shapes, and layout of the black masking layer patches may be dependent on the opaque footprint for the display (before the patches are added). In the example of FIG. 8A, the horizontal portions 54-H are linear, parallel, and regularly spaced. Similarly, the vertical portions 54-V are linear, parallel, regularly spaced, and orthogonal to the horizontal portions 54-H. In other words, in FIG. 8A the black masking layer is a linear, regular grid. This example for an opaque footprint (before the patches are added) is merely illustrative. In general, a display may have any desired opaque footprint. For example, to mitigate diffraction artifacts, the pitch between the vertical portions may be irregular (e.g., randomized) and/or the pitch between the horizontal portions may be irregular (e.g., randomized). Instead or in addition, the vertical and/or horizontal portions may have a zig-zag shape (instead of linear) to mitigate diffraction artifacts.

Figure 9A:
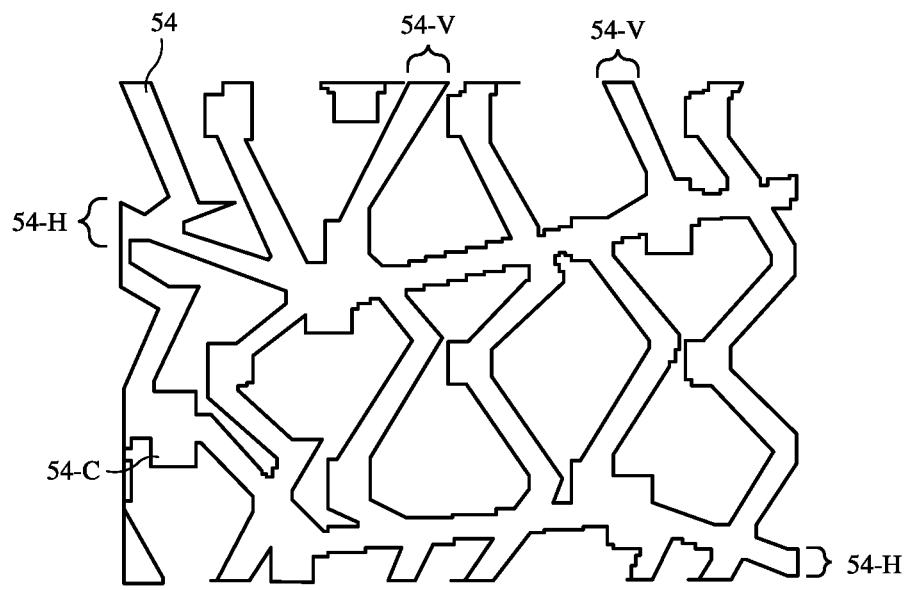
FIGS. 9A and 9B are top views of an illustrative black masking layer in a display in a zig-zag grid before and after patches are added to mitigate diffraction artifacts in accordance with an embodiment.

FIG. 9A is a top view of an illustrative black masking layer 54 with an irregular zig-zag grid before adding the optimally placed patches. As shown, black masking layer 54 includes vertically extending portions 54-V and horizontally extending portions 54-H that form a grid. However, in FIG. 9A, the vertically extending portions 54-V have a zig-zag shape (and therefore may be referred to as zig-zag vertically extending portions 54-V). The horizontally extending portions 54-H also have a zig-zag shape (and therefore may be referred to as zig-zag horizontally extending portions 54-H). In one example (shown in FIG. 9A), the zig-zag shape for each vertically and horizontally extending portion may be selected randomly. This mitigates periodicity in the opaque footprint and mitigates diffraction artifacts. The opaque footprint in FIG. 9A may include via portions 54-C (similar to as in FIG. 8A).

Figure 9B:
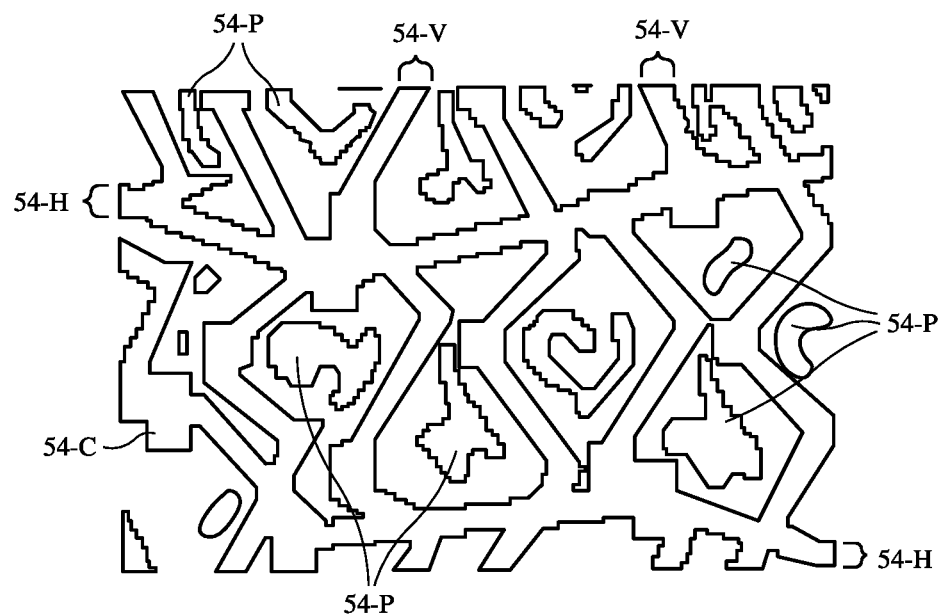

As shown in FIG. 9B, to further mitigate diffraction artifacts, black masking layer 54 may include patches 54-P. As with FIG. 8B, the arrangement for the number, shapes, and layout of the black masking layer patches in FIG. 9B may be selected to optimize diffraction artifacts (e.g., to minimize the loss function as discussed in connection with FIG. 8B). In other words, regardless of the initial layout of the opaque footprint, black masking layer patches may be added to optimize diffraction artifacts in accordance with minimizing the loss function and meeting open-aperture requirements. As shown in FIG. 9B, different apertures may include different numbers of patches 54-P (e.g., some of the apertures include one patch, some of the apertures include two patches, etc.).

There are numerous advantageous to using black masking layer patches to mitigate diffraction artifacts in a display. First, because the display already includes black masking layer, this approach requires no additional components and can be integrated into the display fabrication pipelines without requiring additional steps/components. Second, the computational design algorithm may be easily tuned to achieve user-specified transmission targets and meet fabrication feature-size tolerances.

The black masking layer patches in FIGS. 8B and 9B are designed to minimize diffraction artifacts through a single pixel removal region 332. However, in another possible embodiment, a single display may include first and second pixel removal regions that cover first and second respective sensors. In this type of arrangement, different black masking layer patch arrangements may be used in the first and second pixel removal regions.

Figure 10:
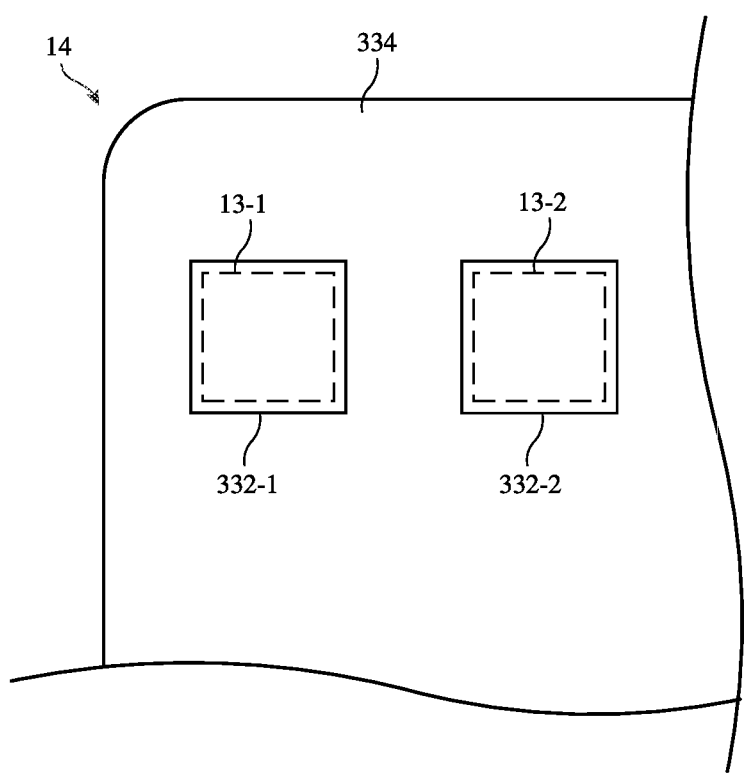
FIG. 10 is a top view of an illustrative display having first and second pixel removal regions with different black masking layer arrangements for respective first and second sensors in accordance with an embodiment.

FIG. 10 shows how different pixel removal regions may have different designs. As shown in FIG. 10, display 14 includes a first pixel removal region 332-1 over a first sensor 13-1 and a second pixel removal region 332-2 over a second sensor 13-2. Each pixel removal region is laterally surrounded by full pixel density region 334 and a portion of full pixel density region 334 is interposed between the first and second pixel removal regions. This example is merely illustrative. If desired, pixel removal regions 332-1 and 332-2 may be directly adjacent without any intervening full pixel density region 334. In this case, the combination of pixel removal regions 332-1 and 332-2 may collectively be laterally surrounded by full pixel density region 334.

Pixel removal region 332-1 may a have a black masking layer with patches having a first layout. Pixel removal region 332-2 may have a black masking layer with patches having a second, different layout. Because pixel removal portions 332-1 and 332-2 have different black masking layer layouts, the images obtained by sensors 13-1 and 13-2 will have different associated diffraction artifacts. The images from 13-1 and 13-2 may therefore be combined (e.g., by control circuitry in the device) to produce an artifact-free image. In other words, the image data from sensor 13-1 may be used to replace the artifact-compromised portion of the image from sensor 13-2. The image data from sensor 13-2 may be used to replace the artifact-compromised portion of the image from sensor 13-1. The resulting image may be artifact-free.

In FIG. 10, black masking layer patches may be arranged in each pixel removal region such that the first and second point source filters (PSFs) associated with the respective first and second sensors are highly complementary. In other words, the shapes of the PSFs can be designed to ensure that diffraction orders that may saturate a specific region in one of the two sensors does not saturate the exact same region in the other camera sensor. Hence the two camera sensors can record enough information in tandem such that an entire un-degraded scene may be computationally reconstructed.

The black masking layer patch layouts for the pixel removal regions 332-1 and 332-2 may be selected to minimize the following loss-function: $L=\Sigma_{j=1}^{N}I_j^a I_j^b$ such that $R>\delta$, where L is the loss function, N is the number of diffraction orders analyzed, $I_j^a$ is the intensity measured by the first sensor (13-1) using a first patch layout, and $I_j^b$ is the intensity measured by the second sensor (13-2) using a second patch layout. The parameter R refers to the ratio of display area that is transparent (un-blocked by the black masking layer, display pixels, or other opaque display components). $\delta$ is a user-specified parameter that enforces the minimum permissible open-aperture ratio. With this loss function, the product of the intensities of a given diffraction order is minimized. In this manner, it is ensured that if one of the two cameras contains a large proportion of intensity in a single diffraction order, the other camera will contain a small proportion of intensity in the same diffraction order and will be able to capture scene-content without risk of saturation.

Figure 11A:
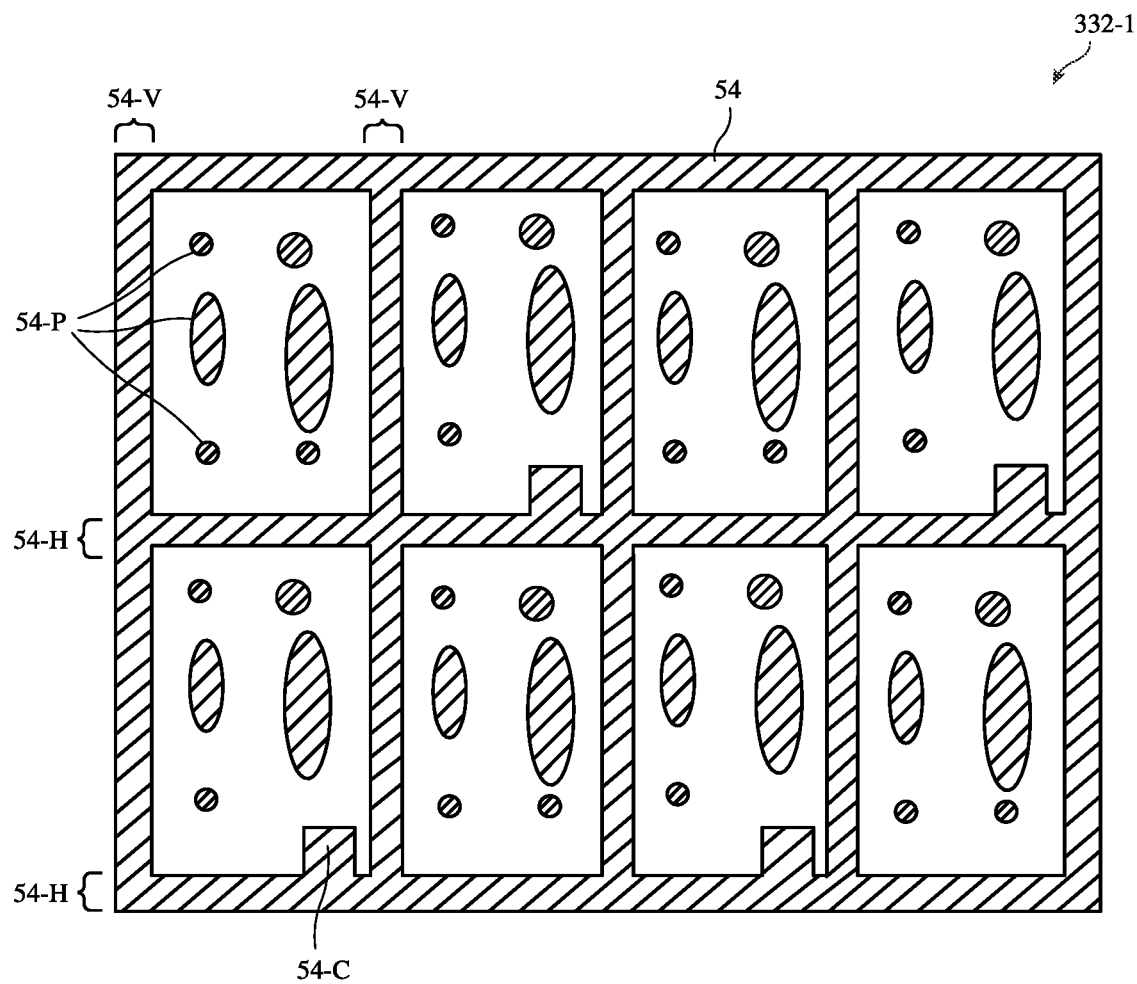
FIGS. 11A and 11B are top views of illustrative black masking layers having the same base layout and different patch layouts for the first and second pixel removal regions of FIG. 10 in accordance with an embodiment.
Figure 11B:
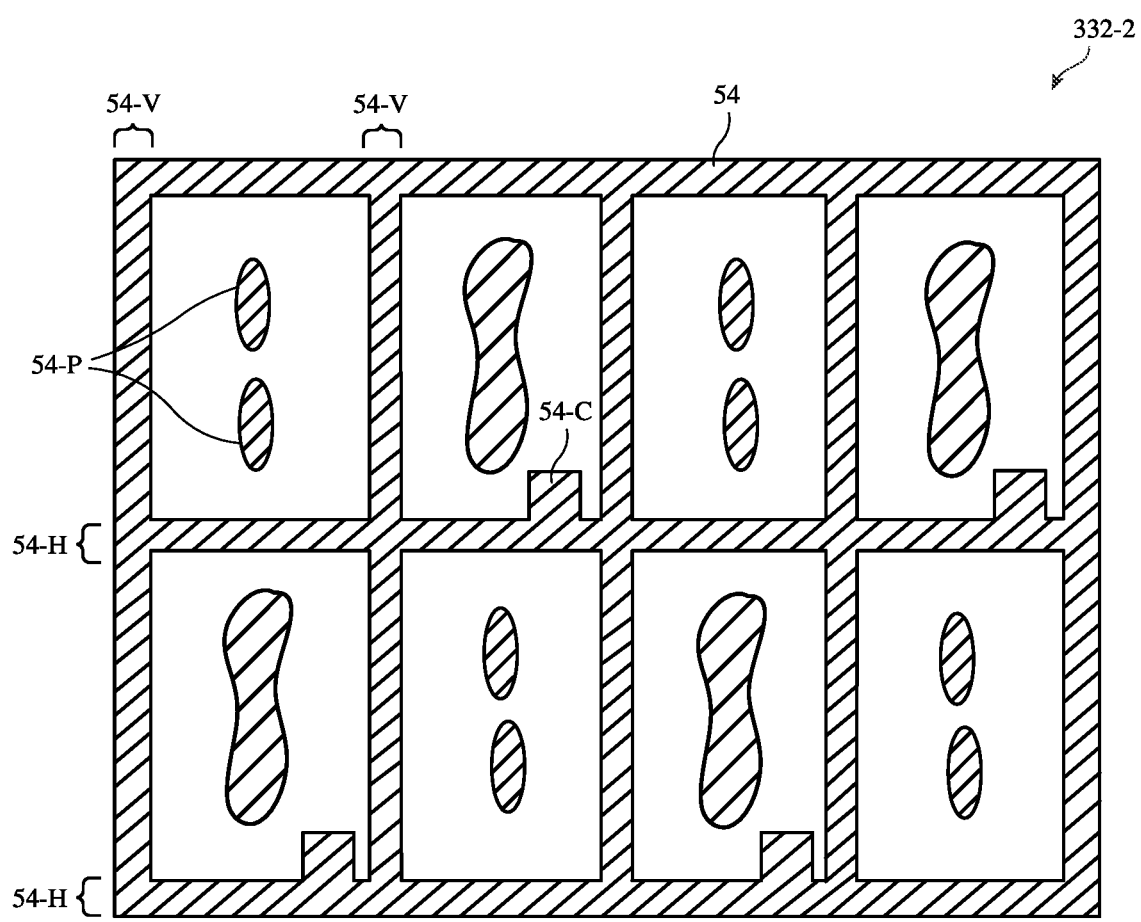

FIGS. 11A and 11B are top views of black masking layers that may be used in pixel removal regions 332-1 and 332-2 of FIG. 10, respectively. As shown, the black masking layer in both FIGS. 11A and 11B includes patches 54-P. However, the arrangement of the patches in pixel removal region 332-1 (FIG. 11A) is different than the arrangement of the patches in pixel removal region 332-2 (FIG. 111B). The different layouts may have complementary point source filters to mitigate diffraction artifacts in a two-sensor system, as discussed above.

It should be noted that full pixel density region 334 in FIG. 10 may have a black masking layer layout of the type shown in FIG. 8A. The pixel removal regions 332-1 and 332-2 in FIG. 10 have the same base layout as in FIG. 8A with additional black masking layer patches as shown in FIG. 11A and 11B.

In FIGS. 11A and 11B, the base layout of the black masking layer (e.g., the horizontally extending portions and vertically extending portions) is the same. This example is merely illustrative. In another desired embodiment, the black masking layer may have an entirely different layout (i.e., different base layout) in pixel removal regions 332-1 and 332-1 in FIG. 10.

Figure 12A:
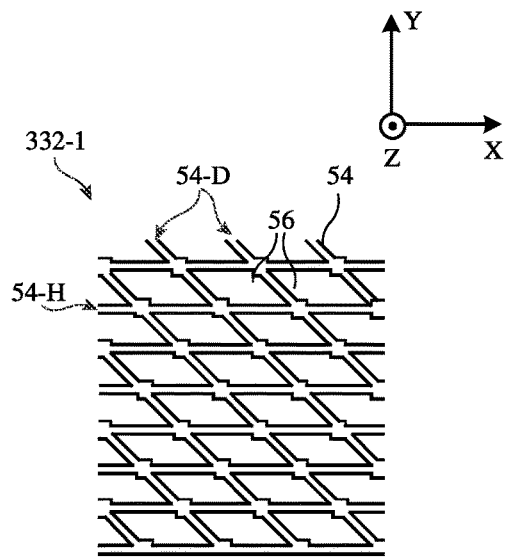
FIGS. 12A and 12B are top views of illustrative black masking layers having different base layouts for the first and second pixel removal regions of FIG. 10 in accordance with an embodiment.
Figure 12B:
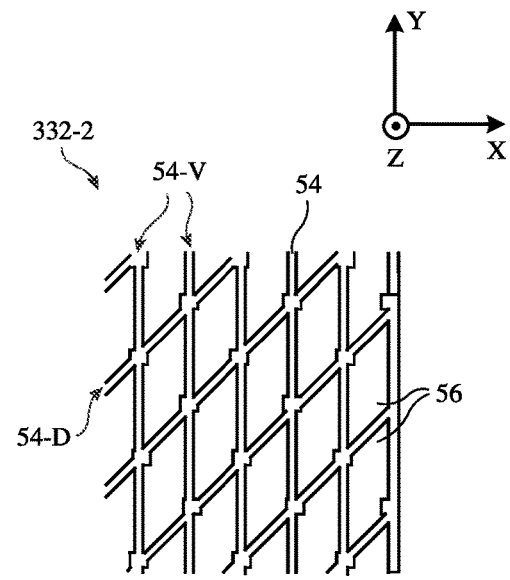

FIGS. 12A and 12B are top views of black masking layers that may be used in pixel removal regions 332-1 and 332-2 of FIG. 10, respectively. As shown, the black masking layer 54 in FIG. 12A includes horizontal portions 54-H and diagonal portions 54-D that define diamond-shaped apertures 56. The diamond-shape apertures are longer in the X-direction than they are in the Y-direction.

In FIG. 12B, the black masking layer 54 includes vertical portions 54-V and diagonal portions 54-D that define diamond-shaped apertures 56. The diamond-shape apertures are longer in the Y-direction than they are in the X-direction. The black masking layer layout in FIG. 12B may be the same as the black masking layer layout in FIG. 12A, except rotated by 90 degrees. Using different layouts for the black masking layer in pixel removal regions 332-1 and 332-2 in this manner may mitigate diffraction artifacts (due to complementary PSFs similar to as discussed in connection with FIGS. 10-11).

Figure 13A:
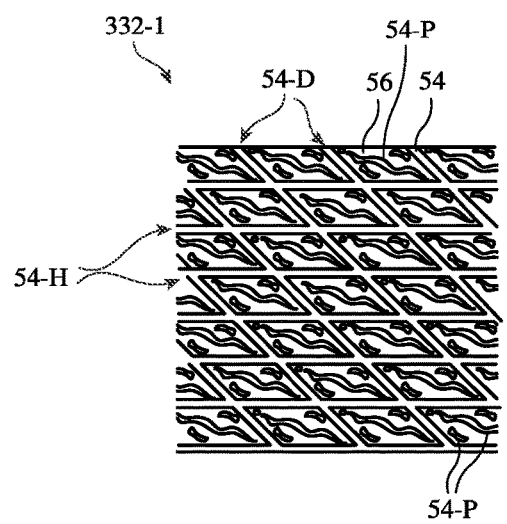
FIGS. 13A and 13B are top views of illustrative black masking layers having different base layouts and patches for the first and second pixel removal regions of FIG. 10 in accordance with an embodiment.
Figure 13B:
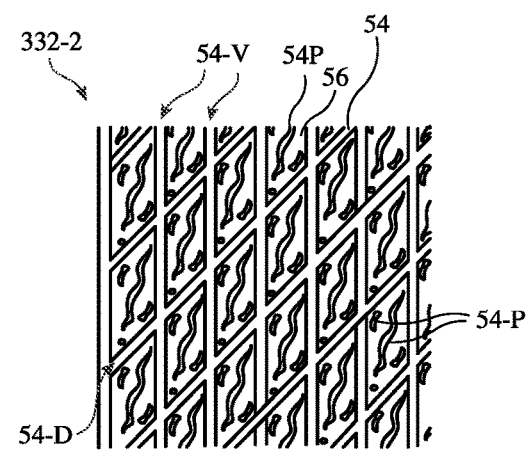

Black masking layer patches may be added to pixel removal regions that have different initial layouts. For example, FIGS. 13A and 13B are top views of black masking layers that may be used in pixel removal regions 332-1 and 332-2 of FIG. 10, respectively. The black masking layer in FIG. 13A has the same layout as in FIG. 12A plus additional patches 54-P. The black masking layer in FIG. 13B has the same layout as in FIG. 12B plus additional patches 54-P. The additional patches may further mitigate diffraction artifacts in an image obtained using sensors 13-1 and 13-2. The layouts for the patches in FIGS. 13A and 13B may be selected to minimize the aforementioned loss function ($L=\sum_{j=1}^{N} I_j^a I_j^b$).

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
   an input-output component; and
   a display having an array of pixels, wherein the display has:
   a black masking layer that is patterned across the array of pixels;
   a first portion having a first pixel density; and
   a second portion having a second pixel density that is lower than the first pixel density, wherein the second portion overlaps the input-output component, wherein the black masking layer in the second portion has a grid that defines a plurality of apertures, and wherein the black masking layer in the second portion additionally includes patches that overlap the apertures; and
   a display cover layer, wherein the black masking layer is interposed between the array of pixels and the display cover layer.

2. The electronic device defined in claim 1, wherein the input-output component comprises a component selected from the group consisting of: an optical sensor and a light source.

3. The electronic device defined in claim 2, wherein the component is the optical sensor, wherein the patches reduce transmission through the second portion, and wherein the patches mitigate diffraction artifacts when the optical component senses light through the second portion.

4. The electronic device defined in claim 1, wherein the patches comprise patches of at least four unique shapes.

5. The electronic device defined in claim 1, wherein the black masking layer has a first transmission and wherein uncovered areas of the apertures have a second transmission that is higher than the first transmission.

6. The electronic device defined in claim 5, wherein each one of the patches is positioned in a respective aperture and is laterally surrounded by the uncovered area of its respective aperture.

7. The electronic device defined in claim 1, wherein at least four discrete patches are formed in a first aperture of the plurality of apertures.

8. The electronic device defined in claim 1, wherein the grid is a regular grid with linear horizontal portions and linear vertical portions.

9. The electronic device defined in claim 1, wherein the grid is an irregular grid with zig-zag horizontal portions and zig-zag vertical portions.

10. An electronic device, comprising:
    a first input-output component;
    a second input-output component; and
    a display having an array of pixels, wherein the display has:
    a black masking layer that is patterned across the array of pixels;
    a first portion having a first pixel density;
    a second portion having a second pixel density that is lower than the first pixel density, wherein the second portion overlaps the first input-output component and wherein the black masking layer in the second portion has a base layout and patches with a first arrangement; and
    a third portion having a third pixel density that is lower than the first pixel density, wherein the third portion overlaps the second input-output component and wherein the black masking layer in the third portion has the base layout and patches with a second arrangement that is different than the first arrangement.

11. The electronic device defined in claim 10, wherein the first input-output component is a first optical sensor and wherein the second input-output component is a second optical sensor.

12. The electronic device defined in claim 11, further comprising:
    control circuitry that is configured to use an image from the second optical sensor to remove diffraction artifacts from an image from the first optical sensor.

13. The electronic device defined in claim 10, wherein the base layout comprises a grid with horizontal portions and vertical portions that define apertures.

14. The electronic device defined in claim 13, wherein the patches are formed in the apertures in both the first and second arrangements.

15. The electronic device defined in claim 13, wherein horizontal portions are linear horizontal portions and wherein the vertical portions are linear vertical portions.

16. The electronic device defined in claim 13, wherein the horizontal portions are zig-zag horizontal portions and wherein the vertical portions are zig-zag vertical portions.

17. The electronic device defined in claim 10, wherein the first input-output component comprises a light source.

18. An electronic device, comprising:
    a first input-output component;
    a second input-output component; and
    a display having an array of pixels, wherein the display has:
    a black masking layer that is patterned across the array of pixels;
    a first portion having a first pixel density;
    a second portion having a second pixel density that is lower than the first pixel density, wherein the second portion overlaps the first input-output component and wherein the black masking layer in the second portion has a first base layout; and
    a third portion having a third pixel density that is lower than the first pixel density, wherein the third portion overlaps the second input-output component and wherein the black masking layer in the third portion has a second base layout that is different than the first base layout.

19. The electronic device defined in claim 18, wherein the first input-output component is a first optical sensor and wherein the second input-output component is a second optical sensor.

20. The electronic device defined in claim 18, wherein the second base layout has a second footprint that is rotated relative to a first footprint of the first base layout.

21. The electronic device defined in claim 18, wherein the black masking layer in the second portion has first patches in addition to the first base layout and wherein the black masking layer in the third portion has second patches in addition to the second base layout.

* * * * *